(12) United States Patent
Hartmann et al.

(10) Patent No.: US 9,246,045 B2
(45) Date of Patent: Jan. 26, 2016

(54) METHOD FOR FABRICATING A PHOTODETECTOR

(71) Applicant: COMMISSARIAT À L'ENERGIE ATOMIQUE ET AUX ENERGIES ALTERNATIVES, Paris (FR)

(72) Inventors: Jean-Michel Hartmann, Montbonnot Saint-Martin (FR); Yann Bogumilowicz, Grenoble (FR); Jean-Marc Fedeli, Saint-Egrève (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/570,324

(22) Filed: Dec. 15, 2014

(65) Prior Publication Data

US 2015/0171259 A1    Jun. 18, 2015

(30) Foreign Application Priority Data

Dec. 13, 2013  (FR) ...................................... 13 02934

(51) Int. Cl.
*H01L 31/18* (2006.01)
*H01L 31/105* (2006.01)
*G02B 6/12* (2006.01)

(52) U.S. Cl.
CPC ........ *H01L 31/1804* (2013.01); *G02B 6/12004* (2013.01); *H01L 31/105* (2013.01)

(58) Field of Classification Search
USPC ........................................ 438/699, 25, 20, 15
See application file for complete search history.

(56) References Cited

U.S. PATENT DOCUMENTS

| | | |
|---|---|---|
| 2007/0104441 A1 | 5/2007 | Ahn et al. |
| 2011/0012221 A1 | 1/2011 | Fujikata et al. |
| 2012/0126286 A1 | 5/2012 | Na et al. |
| 2014/0197507 A1* | 7/2014 | Assefa ............. H01L 31/02327 257/432 |
| 2014/0312443 A1* | 10/2014 | Assefa ................... G02B 6/13 257/432 |

OTHER PUBLICATIONS

Ren, et al., "Thin Dielectric Spacer for the Monolithic Integration of Bulk Germanium or Germanium Quantum Wells with Silicon-on-Insulator Waveguides," *IEEE*, Aug. 2011, vol. 3, No. 4, pp. 739-747.

* cited by examiner

*Primary Examiner* — Asok K Sarkar
(74) *Attorney, Agent, or Firm* — Oliff PLC

(57) ABSTRACT

Fabrication of a photodetector is performed on a substrate comprising a first portion successively provided with a first semiconductor film, an electrically insulating layer, a second semiconductor film, and a protection layer. The substrate also comprises a second portion not comprising the second semiconductor film. It further comprises a third portion not comprising the second semiconductor film and the protection layer. The second semiconductor film is etched in the first portion to form a cavity. A PIN/NIP diode is formed in the third portion at least by means of deposition of a third semiconductor material which also comes and fills the cavity. A conversion layer is deposited to absorb a light signal originating from the second semiconductor film and to convert the light signal into an electric signal, the conversion layer electrically connecting the PIN/NIP diode.

7 Claims, 7 Drawing Sheets

METHOD FOR FABRICATING A PHOTODETECTOR

BACKGROUND OF THE INVENTION

The invention relates to a method for fabricating a photodetector.

STATE OF THE ART

In conventional manner, photodetectors are used to convert a light signal into an electric signal. The photodetector comprises a detection area which performs conversion of the photons into electrons and an electric processing area which collects the electrons to transform them into an electric signal for other circuits.

The publication by Ren et al "Thin Dielectric Spacer for the Monolithic Integration of Bulk Germanium or Germanium Quantum Wells With Silicon-on-Insulator Waveguides", IEEE Photonics Journal Vol. 3, No. 4, p. 739 (2011) describes a particular photodetector.

A substrate of silicon on insulator type is provided and it comprises a silicon support, an electrically insulating layer and a second silicon film. The second silicon film is etched a first time to form a waveguide. A second etching is performed to access the silicon support.

In order to perform epitaxial growth of better quality, lateral spacers made from silicon oxide are formed on the edges of the trench. In this way, selective growth of the germanium is performed only from the bottom of the trench, i.e. from the silicon support.

The germanium growth is broken down into a first deposition of P-doped germanium, a second deposition of intrinsic germanium and a third deposition of N-doped germanium. This growth step chaining enables a diode of PIN type to be formed.

The intrinsic part of the diode is facing the waveguide.

It is however observed that this configuration is not as efficient as expected. It is also observed that the fabrication method is complicated to implement.

OBJECT OF THE INVENTION

The object of the invention is to present a method for fabricating a photodetector that is easier to implement.

This result tends to be achieved by means of a method comprising:
  providing a substrate comprising:
    a first portion successively provided with a first semiconductor film, an electrically insulating layer, a second semiconductor film, and a protection layer,
    a second portion different from the first portion and successively provided with the first semiconductor film, the electrically insulating layer, and the protection layer and not comprising the second semiconductor film,
    a third portion different from the first and second portions and provided with the first semiconductor film, and not provided with the second semiconductor film and the protection layer,
  partially etching the second semiconductor film in the first portion to form a cavity,
  depositing at least a third semiconductor material so as to form a diode of PIN type in the third portion from the first semiconductor film and to fill the cavity of the first portion,
  depositing a conversion layer configured to absorb a light signal coming from the second semiconductor film and to convert the light signal into an electric signal, the conversion layer electrically connecting the PIN diode.

BRIEF DESCRIPTION OF THE DRAWINGS

Other advantages and features will become more clearly apparent from the following description of particular embodiments of the invention given for non-restrictive example purposes only and represented in the appended drawings, in which.

DETAILED DESCRIPTION

Figure 1:
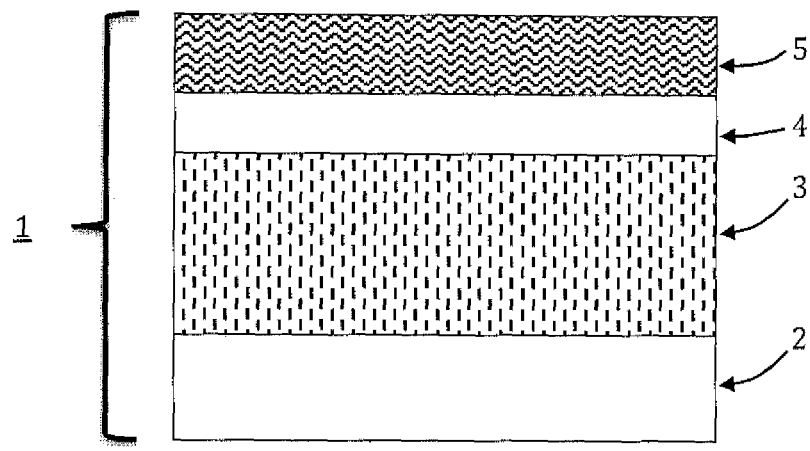
FIG. 1 represents a stack of layers used for fabrication of a photodetector, in schematic manner, in cross-section.

FIG. 1 shows a substrate 1 successively comprising a first semiconductor film 2, an electrically insulating layer 3, a second semiconductor film 4 and a protection layer 5. The four layers are of different natures to define an interface between two consecutive layers.

First semiconductor film 2 can form the substrate support or it is deposited on the support of substrate 1. First semiconductor film 2 is advantageously monocrystalline in order to obtain a diode of better quality. In preferential manner, first semiconductor film 2 comprises or is connected to a processing circuit of the electric signal emitted by the photodetector. First semiconductor film 2 is for example made from silicon, but it is also possible to use other semiconductor materials of valence IV or other suitable materials.

Electrically insulating layer 3 can be formed by any suitable material, for example by an oxide, a nitride, or a mixture of the latter. For example purposes, electrically insulating layer 3 can be made from silicon oxide or from silicon nitride.

Second semiconductor film 4 is designed to form a waveguide on the electrically insulating layer. Second semiconductor film 4 is advantageously monocrystalline in order to limit the attenuation of the light signal. In preferential manner, second semiconductor film 4 is connected to a light signal generator (not shown). Second semiconductor film 4 is for example made from silicon, but it is also possible to use other semiconductor materials of valence IV or other suitable materials.

The stack presented can be achieved simply by means of a substrate 1 of semiconductor-on-insulator type and more particularly of silicon-on-insulator type.

Protection layer 5 can be formed by any suitable material. Protection layer 5 can be formed by an electrically conducting or an electrically insulating material. In preferential manner, an electrically insulating material is used. Protection layer 5 can be made from oxide, nitride, a metallic material or a silicide. In preferential manner, protection layer 5 is made from silicon oxide or from silicon nitride.

The refractive indexes of protection layer 5, of second semiconductor film 4 and of electrically insulating layer 3 are chosen in such a way that second semiconductor film 4 forms a waveguide. In advantageous manner, the materials are chosen so that second semiconductor film 4 is a waveguide for a radiation having a wavelength of more than 1100 nm.

Figure 2:
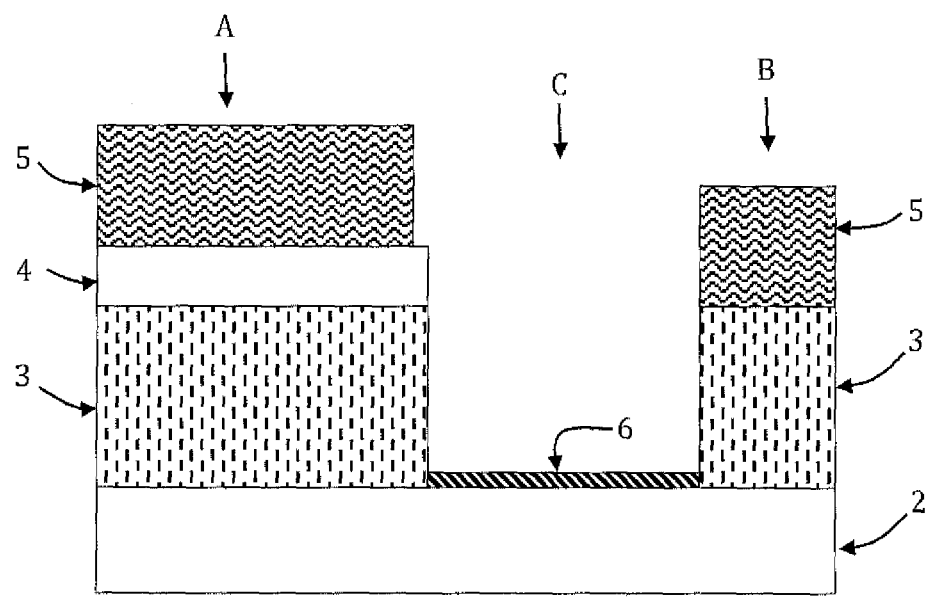
FIGS. 2, 7, 11, 12 and 13 represent steps of fabrication of a photodetector, in schematic manner, in cross-section.

As illustrated in FIG. 2, substrate 1 can be broken down into at least three different portions which present different stacks. The three portions are distinct from one another.

In a first portion A, the stack successively comprises first semiconductor film 2, electrically insulating layer 4, second semiconductor film 3, and protection layer 5.

In a second portion B, the stack successively comprises first semiconductor film 2, electrically insulating layer 3, and protection layer 5. Second portion B does not comprise second semiconductor film 4. Second portion B is distinct from first portion A.

In a third portion C, the stack comprises first semiconductor film 2. Third portion C does not comprise protection layer 5 and second semiconductor film 4. First semiconductor film 2 can be left free or it can be covered by a covering layer 6. The purpose of covering layer 6 is to protect first semiconductor film 2 during the subsequent technological steps and more particularly during the etching steps. Covering layer 6 can be formed by any suitable material. Covering layer 6 can be formed by electrically insulating layer 3 and advantageously by a thinned area of electrically insulating layer 3. As a variant, another material can be used. Third portion C is distinct from first and second portions A and B.

Substrate 1 can be produced in different ways. The method that is simple and quick to implement is described.

Figure 3:
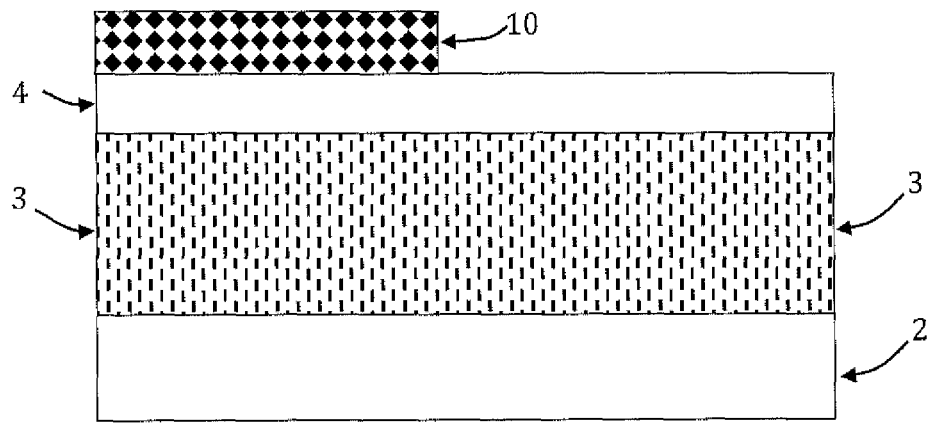
FIGS. 3 to 6 represent steps of producing a particular substrate usable for fabrication of a photodetector, in schematic manner, in cross-section.
Figure 4:
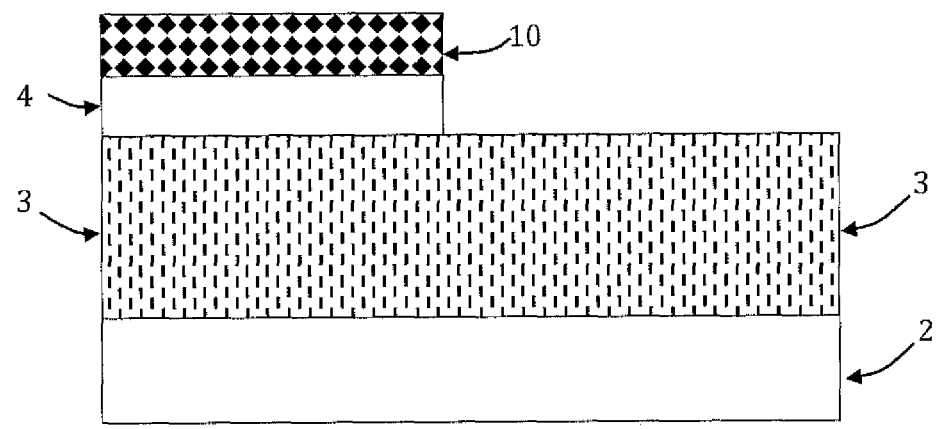

A substrate 1 of semiconductor on insulator type is provided (FIG. 1). As illustrated in FIG. 3, substrate 1 is covered by a first etching mask 10. As illustrated in FIG. 4, a first etching is performed to etch second semiconductor film 4 and to define the shape of the waveguide. First etching mask 10 enables the shape or substantially the shape of first portion A to be defined.

Figure 5:
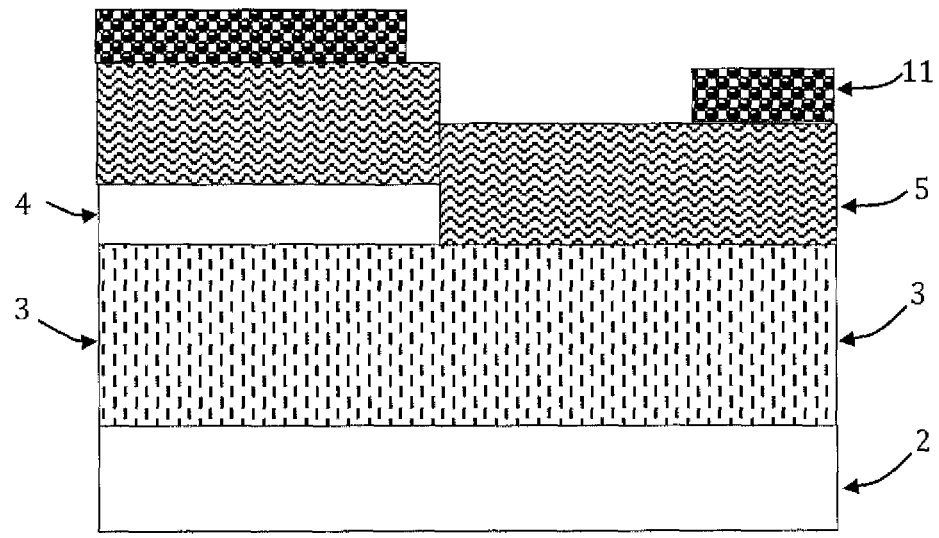

As illustrated in FIG. 5, protection layer 5 is deposited and a second etching mask 11 is formed. A second etching is performed to define the shape of third portion C and if this is the case to access first semiconductor film 2. In advantageous manner, protection layer 5 covers the lateral surfaces and the top surface of the waveguide.

Figure 6:
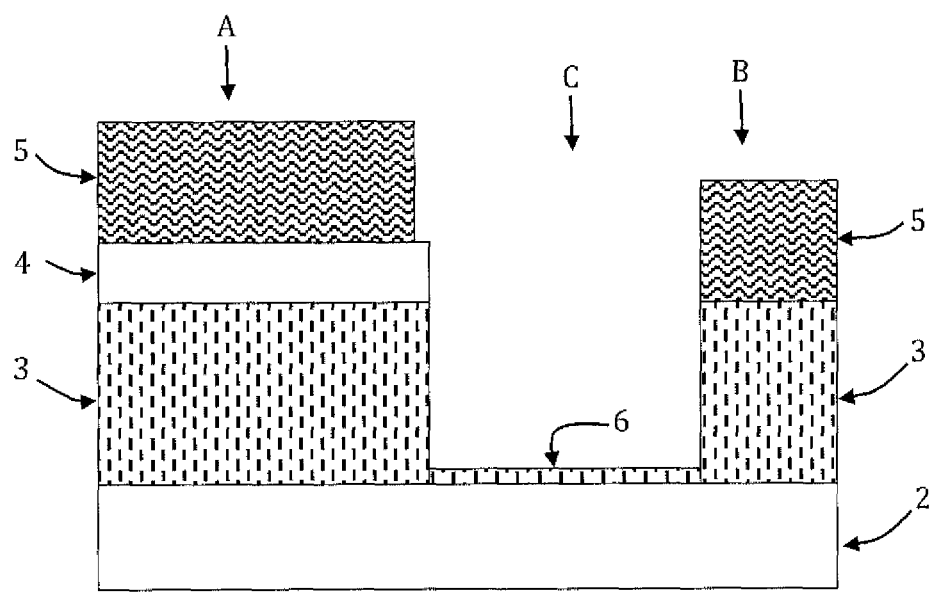

The pattern of the area to be etched by means of second etching mask 11 (third portion C) advantageously overlaps the pattern of the area of first etching mask 10 that is to be preserved. In this configuration illustrated in FIG. 6, the etching eliminates protection layer 5 above and to the side of the waveguide which then becomes accessible. In this configuration, the waveguide stops at the interface between first portion A and third portion C.

Figure 7:
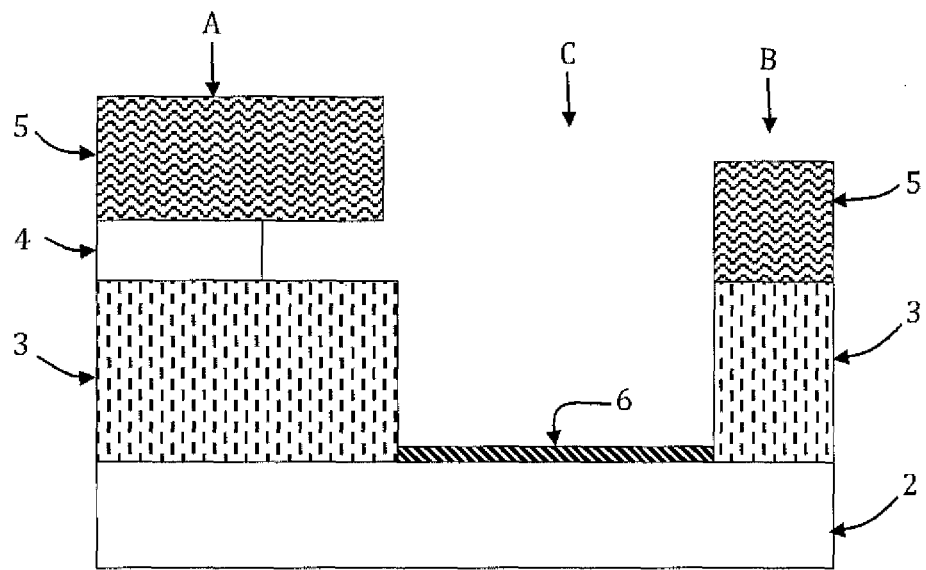

As illustrated in FIG. 7, etching is performed so as to partially eliminate second semiconductor film 4 in first portion A. Etching of second semiconductor film 4 can be performed by any suitable technique. In advantageous manner, etching is selective and includes an isotropic part.

For example purposes, etching is performed by plasma etching. As a variant, etching is performed by means of a gaseous hydrochloric acid which enables materials such as silicon or silicon-germanium to be etched with a good etching selectivity with respect to silicon oxide or silicon nitride.

When protection layer 5 covers the side faces and the top surface of the waveguide, partial etching enables a pass-through cavity to be created in protection layer 5.

In advantageous manner, etching of second semiconductor film 4 is performed by gaseous hydrochloric acid which prevents formation of etching by-products on the substrate such as polymers.

In advantageous manner, the etching step of second semiconductor film 4 is performed with protection of first semiconductor film 2 by covering layer 6.

However, it can be envisaged to have etching of second semiconductor film 4 without protection of first semiconductor film 2. In the latter case, it is advantageous to have a higher etching rate for second semiconductor film 4 than for first semiconductor film 2.

In a particular embodiment, the accessible surface of first semiconductor film 2 is in a plane (100) whereas the accessible surface of second semiconductor film 4 is in a plane (110) which enables a difference of etching rate to be had. In addition to a difference of crystalline planes, it is also possible to use a difference of chemical compositions to obtain a difference of etching rates.

At least a third semiconductor material 7 is deposited so as to form a PIN diode 8 in third zone C. Third semiconductor material 7 is deposited on first semiconductor film 2 so as to electrically connect PIN diode 8 with first semiconductor film 2.

PIN diode 8 successively comprises a first P-doped electrode 8P, an intrinsic area 8I and a second N-doped electrode 8N. The direction of the PIN diode can vary according to the embodiments. It is therefore possible to form a PIN or NIP diode if the order of layers starting from first semiconductor film 2 is respected.

If first semiconductor film 2 is covered by covering layer 6, an additional etching is performed to release this surface of film 2. For example purposes, this etching can be performed by means of hydrofluoric acid diluted in water if covering layer 6 is made from silicon oxide.

Figure 8:
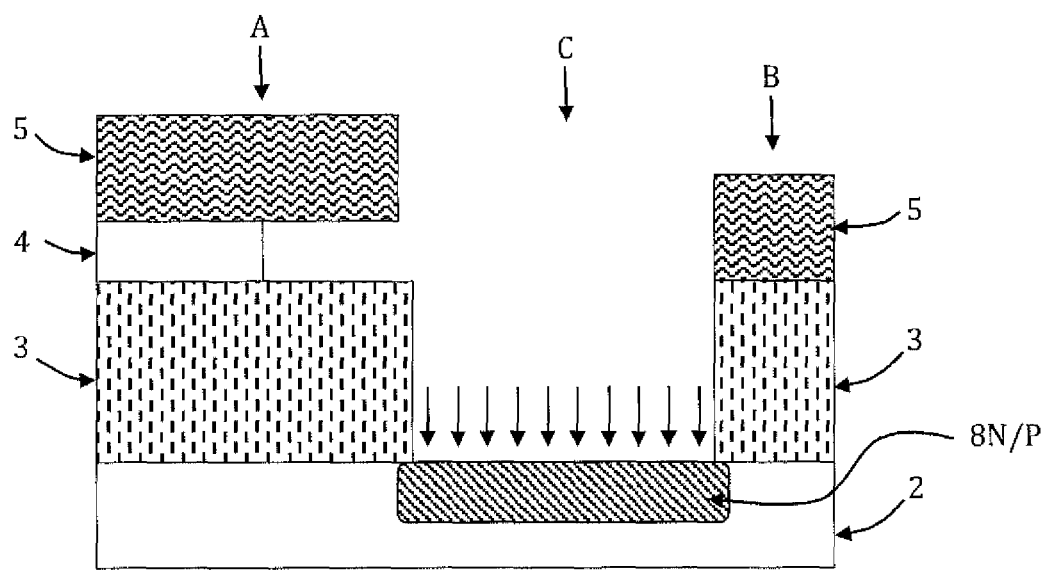
FIGS. 8 and 9 represent alternative fabrication steps to steps 11 and 12, in schematic manner, in cross-section.

PIN diode 8 can be formed in different manners. In a first embodiment illustrated in FIG. 8, an implantation is performed to dope first semiconductor film 2 and form first electrode 8. The first electrode can be N-doped or P-doped (8N/P). In advantageous manner, covering layer 6 is kept to perform ion implantation in first semiconductor film 2.

Figure 9:
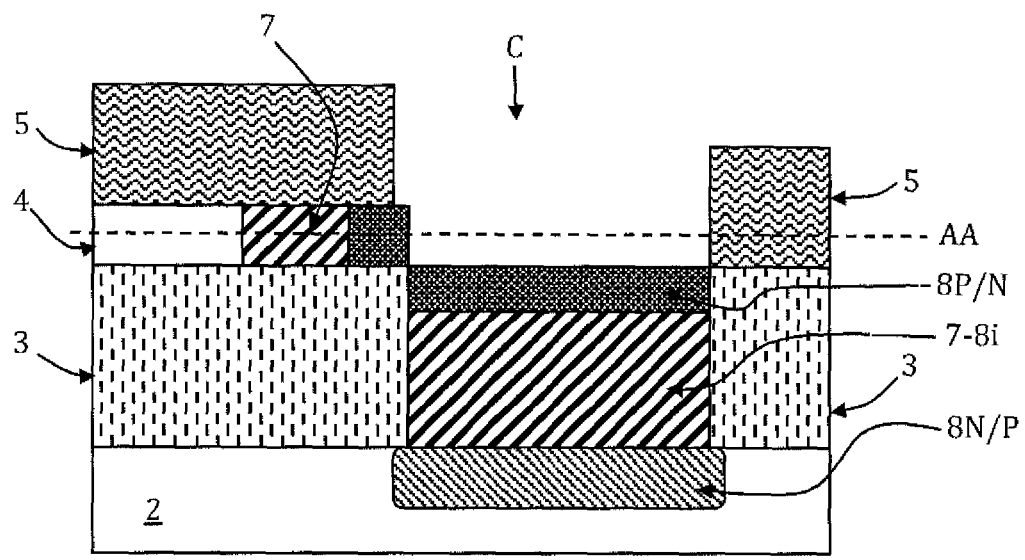
Figure 10:
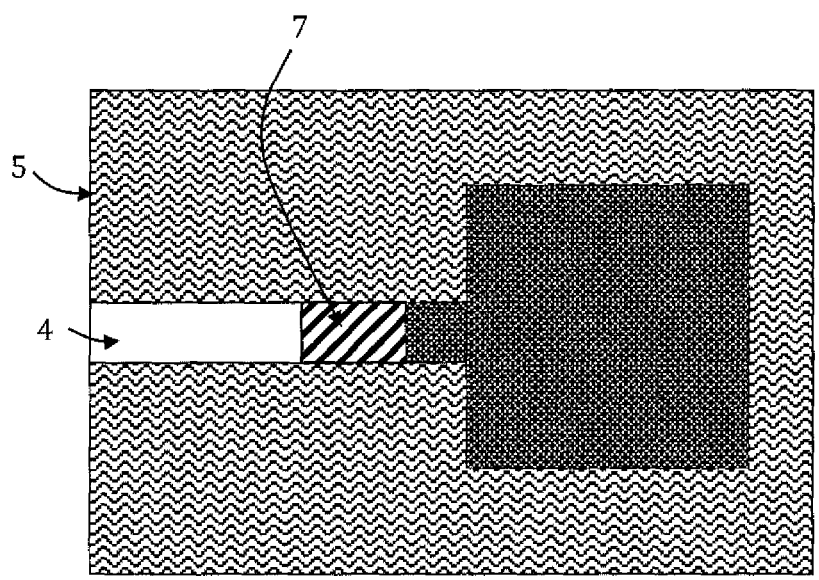
FIG. 10 represents the substrate during the step illustrated in FIG. 9, in schematic manner, in top view.

As illustrated in FIG. 9, intrinsic third semiconductor material 7 is then deposited in third portion C. In a first alternative embodiment, a doped material is deposited to form the P-doped or N-doped second electrode. In another alternative embodiment, an ion implantation is performed to dope a part of intrinsic material 7 and to form a P-doped or N-doped area (8P/N). FIG. 10 illustrates the arrangement of the waveguide with respect to the cavity formed in protection layer 5, in top view, in a cross-section taken along the plane AA. For greater facility, abstraction is made of protection layer 5 above the waveguide.

It is advantageous to dope first semiconductor film 2 if the latter is not sufficiently doped to form the N or P electrode or if it is doped of opposite type. For example, if first semiconductor film 2 is P-doped, it is advantageous to perform ion implantation of N-type dopants to form an N-doped first electrode 8N.

In a second embodiment, third semiconductor material 7 is deposited intrinsic. Ion implantation is then performed to form a doped area 8N/P and another implantation is then performed to form another doped area 8P/N.

When deposition of third semiconductor material 7 is performed, there is also deposition in first portion A from second semiconductor film 4.

Figure 11:
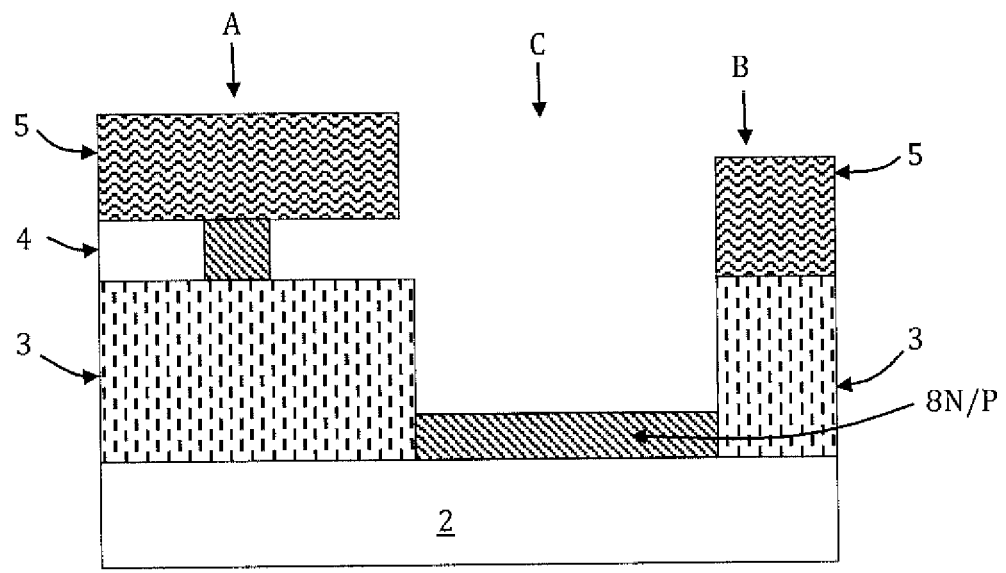
Figure 12:
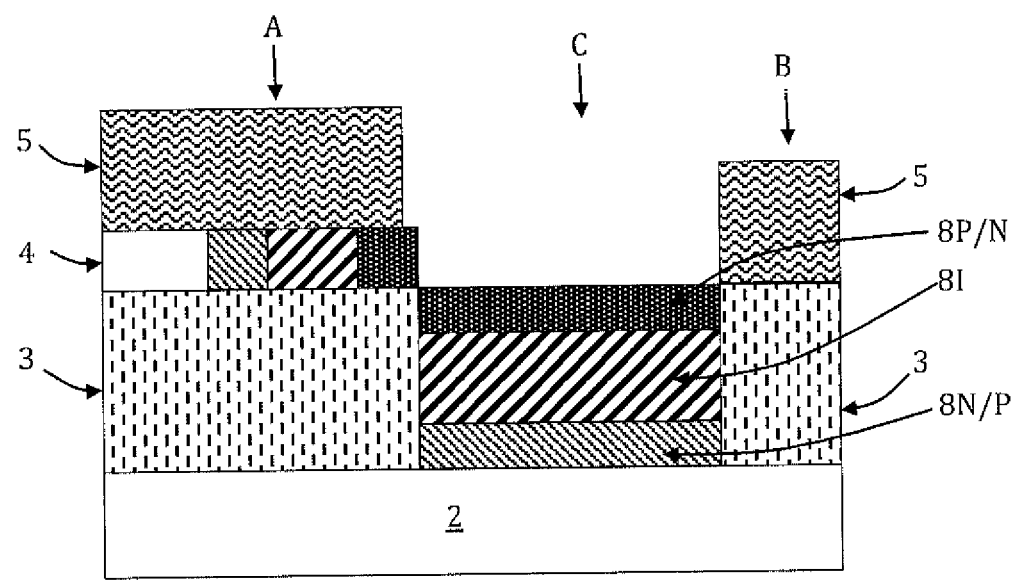

In another alternative embodiment illustrated in FIGS. 11 and 12, the layers forming diode 8 are deposited doped one after the other. There is then deposition of an N-doped or P-doped layer, of an intrinsic layer and of a P-doped or N-doped layer. The stack formed in third portion C in vertical manner is located in first portion A in horizontal manner.

The different layers deposited to form the PIN diode are visible in the waveguide. It is therefore advantageous to make these layers from a material which has a low light radiation absorption in order to maximize the absorption of the photons in the conversion area. Advantageously, the materials in the waveguide are not doped, or are weakly doped i.e. with a doping less than or equal to $10*10^{18}$ at/cm$^3$ or even $10*10^{17}$ at/cm$^3$.

In a preferential embodiment, the materials deposited to form PIN diode 8 are the same materials as those used to form the waveguide.

Figure 13:
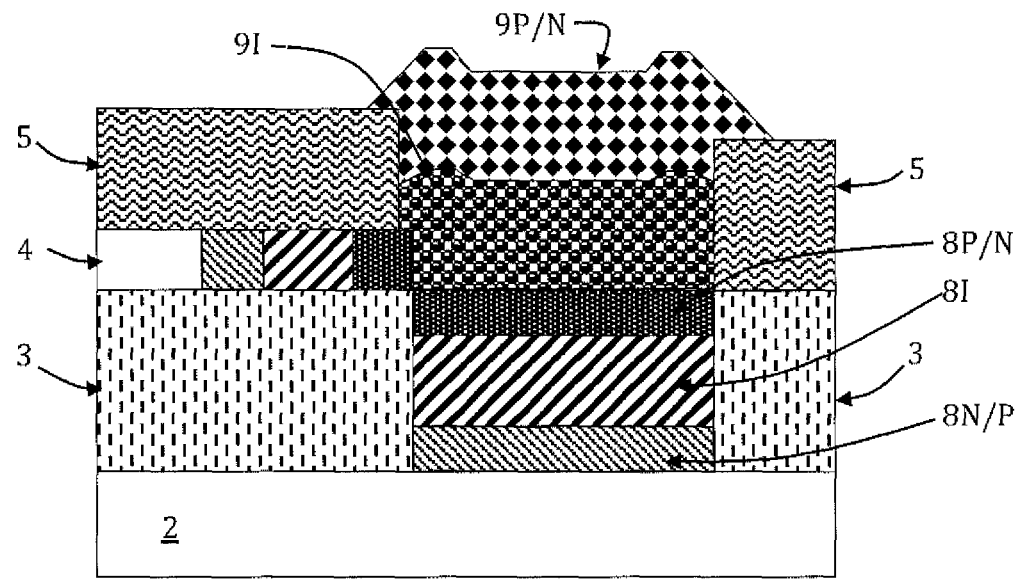
Figure 14:
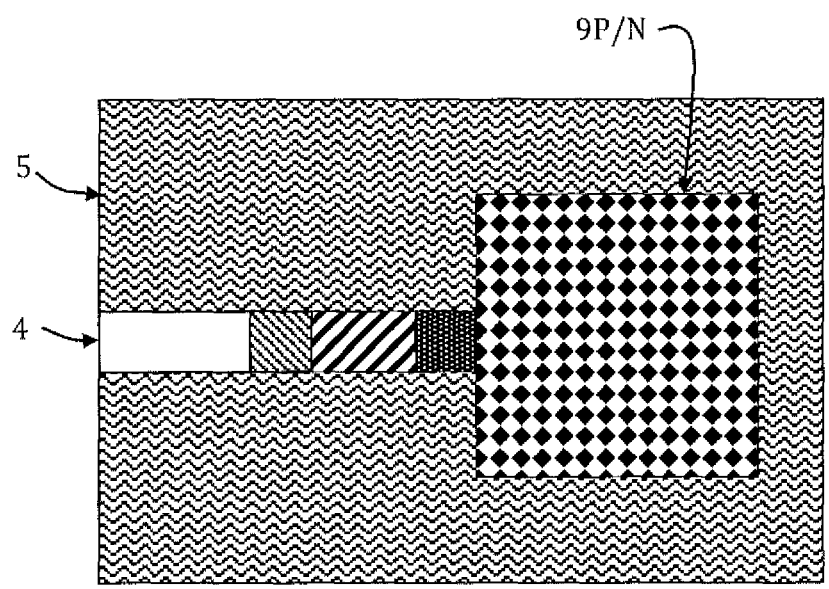
FIG. 14 represents the substrate during the step illustrated in FIG. 13, in schematic manner, in top view.

As illustrated in FIGS. 13 and 14, after formation of PIN diode 8, it is advantageous to form conversion material 9 which will perform absorption of the photons and conversion of the latter into electric charges. Conversion material 9 is also called detection material.

Detection material 9 is deposited in first portion A above PIN diode 8 and in electric contact with the latter so that the charges created transit in the PIN diode. Conversion material 9 is partially doped in order to prolong the direction of propagation of the charge carriers. The conversion material is doped in such a way as to form diode 8 or PIPIN or NINIP structure. Doped area 9P/N of the detection material is of the same type as second electrode 8P/N of the PIN diode, i.e. the electrode that is closer to the waveguide.

As previously, the detection material can be deposited intrinsic and is then doped, for example by ion implantation. It is also possible to deposit an intrinsic material in a first stage and to then deposit a doped material which will form electrode 9P/N.

Detection material 9 is also in direct contact with the waveguide so as to directly receive the light signal to convert it into an electric signal. This direct connection enables the efficiency of the photodetector to be enhanced.

Detection material 9 is in the extension of the waveguide so as to receive the maximum amount of light signal. In an advantageous embodiment, the interface between PIN diode 8 and conversion material 9 is in the same plane as the interface between electrically insulating layer 3 and second semiconductor film 4. In this way, conversion layer 9 is facing the waveguide to receive the maximum amount of light signal in order to efficiently transform it into electric charges.

In an alternative embodiment that is optically more advantageous, the interface between conversion layer 9 and PIN diode 8 is located underneath the interface between electrically insulating layer 3 and second semiconductor film 4.

In another alternative embodiment that is optically less advantageous, the interface between conversion layer 9 and PIN diode 8 is located above the interface between electrically insulating layer 3 and second semiconductor film 4. In this way, conversion layer 9 partially absorbs the light radiation and the material forming diode 8 also receives a part of the light radiation. In this configuration, the conversion efficiency is lesser.

In a preferred embodiment, the interface between the waveguide and conversion layer 9 is in the extension of the side wall of electrically insulating layer 3 or substantially in the extension of the side wall. Advantageously, the waveguide is present only in first portion A and conversion layer 9 is present only in third portion C. However, in another embodiment, the third portion can be comprised between two first portions A.

If conversion material 9 encroaches greatly in first portion A, absorption of the light radiation performed in first portion A and the electric charges formed in first portion A have difficulty reaching PIN diode 8. This architecture does not have a good conversion efficiency.

In an advantageous embodiment, growth of the different layers is performed in epitaxial manner in order to reproduce the crystal lattice of the initial surface. In this way, PIN diode 8 has the same crystalline structure as that of first semiconductor film 2. The same is the case for the deposited material which extends the etched waveguide. It is then particularly advantageous to use monocrystalline first and second semiconductor films.

In this case, conversion layer 9 comprises a part with the same crystalline structure as that of first semiconductor film 2 and a part with the same crystalline structure as that of second semiconductor film 4 (even if the lattice parameters are not identical).

It was observed in unexpected manner that, in conversion layer 9, the coexistence of the crystal lattice originating from the waveguide with the crystal lattice originating from the first semiconductor film does not introduce crystal defects greatly limiting the conversion of the light signal into an electric signal.

To form the photodetector, it is preferable to perform one or more selective epitaxy steps in order to form the PIN diode and/or the conversion material. The use of a selective growth enables a crystal growth to be had only from the crystal seed. There is therefore not or hardly any growth from the surfaces made from amorphous material. The use of a crystal growth enables a PIN diode 8 to be formed with interfaces that are parallel to one another which improves its operation. This may enable a completely monocrystalline NINIP or PIM diode to be formed which is advantageous to reduce the electronic noise of the diode.

The same is the case for the waveguide which presents a better performance if the grain boundaries and the crystal defects on the path of the light signal are reduced.

A selective growth can be obtained in different manners, for example by means of a chemistry using chlorinated precursors which is acknowledged as being intrinsically selective.

As a variant, it is also possible to perform selective growth by alternating non-selective growth phases and selective etching phases. During the selective etching phase, the monocrystalline material is less etched than the poly-crystalline material or the amorphous material.

When formation of conversion layer 9 is performed, it is preferable to completely fill the cavity formed by protection layer 5. In this way, a large quantity of material can be used to efficiently convert the light signal into an electric signal. In order to ensure optimal filling of the cavity, it is preferable to perform growth of conversion layer 9 which overlaps beyond protection layer 5. This precaution in general enables filling of the cavity to be ensured even if the deposited material has a growth with facets.

It is subsequently possible to localise the conversion layer in the protection layer by means of a planarization step. Planarization can be performed by any suitable technique, for example by means of a chemical mechanical polishing step.

In comparison with the structure disclosed in the publication by Ren et al. cited above, it is observed that the performances are improved as there is no lateral spacer between the waveguide and conversion area 9. In this manner, there is no generation of an additional optical interface which introduces optical reflections which reduce the sensitivity of the diode.

It is observed that the photodetector can have a PIN diode 8 formed from a different material from conversion material 9, for example germanium which facilitates the formation of an avalanche device where high voltages are applied. In a preferred embodiment, the N and P electrodes and the intrinsic area are formed from a silicon-based material which enables the formation of an efficient avalanche photodetector.

It is also observed that etching of the waveguide before the PIN diode is formed prevents parasite growth of material in the third portion C with large facets. These facets hamper the growth of conversion layer 9.

It is further observed that the use of a second portion B devoid of second semiconductor material 4 enables the number of semiconductor material surfaces which open into third portion C to be limited. This configuration limits the risks of crystal defect generation during the different growth steps. In the illustrated embodiment, there is a single waveguide which opens onto conversion material 9.

The invention claimed is:

1. A method for fabricating a photodetector, comprising the following steps:
    providing a substrate including:
        a first portion successively provided with a first semiconductor film, an electrically insulating layer, a second semiconductor film designed to form a waveguide, and a protection layer,
        a second portion distinct from the first portion and successively provided with the first semiconductor film, the electrically insulating layer, and the protection layer and devoid of the second semiconductor film,
        a third portion distinct from the first and second portions and provided with the first semiconductor film, and devoid of the second semiconductor film and the protection layer, the third portion being arranged between the first and second portions,
    partially etching the second semiconductor film in the first portion to form a cavity delineated by the protection layer and the electrically insulating layer,
    depositing at least a third semiconductor material so as to form a PIN diode or a NIP diode in the third portion from the first semiconductor film and to fill the cavity of the first portion,
    depositing a conversion layer in contact with the second semiconductor film, the conversion layer being configured to absorb a light signal coming from the second semiconductor film and to convert the light signal into an electric signal, the conversion layer electrically connecting the PIN diode or the NIP diode to form a structure of PIPIN or NINIP type.

2. The method for fabricating according to claim 1, wherein an interface between the conversion layer and a top electrode of the PIN diode or the NIP diode is in a plane including an interface between the electrically insulating layer and the second semiconductor film.

3. The method for fabricating according claim 1, further comprising an ion implantation step in the third portion for forming a bottom electrode of the PIN diode or NIP in the first semiconductor film.

4. The method for fabricating according to claim 1, wherein an interface between the conversion layer and the third semiconductor material defines one plane including one lateral surface of the electrically insulating layer.

5. The method for fabricating according to claim 1, wherein the PIN diode or NIP diode is formed by a stack of silicon-based monocrystalline layers and wherein the first semiconductor film is monocrystalline.

6. The method for fabricating according to claim 5, wherein the conversion layer is made from germanium.

7. The method for fabricating according to claim 1, wherein the conversion layer comprises a first part with a first crystalline structure identical to a crystalline structure of the first semiconductor film and a second part with a second crystalline structure identical to a crystalline structure of the second semiconductor film.

\* \* \* \* \*